(12) United States Patent
Wu et al.

(10) Patent No.: US 7,138,848 B2
(45) Date of Patent: Nov. 21, 2006

(54) SWITCHED CAPACITOR INTEGRATOR SYSTEM

(75) Inventors: Dolly Wu, Dallas, TX (US); Paul Ferguson, Jr., North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 60 days.

(21) Appl. No.: 10/824,012

(22) Filed: Apr. 14, 2004

(65) Prior Publication Data

US 2005/0231411 A1     Oct. 20, 2005

(51) Int. Cl.
*G06F 7/64* (2006.01)

(52) U.S. Cl. .................. 327/337; 327/344; 327/345

(58) Field of Classification Search ............ 327/94–96, 327/336, 337, 344, 345
See application file for complete search history.

(56) References Cited

U.S. PATENT DOCUMENTS

| | | | | |
|---|---|---|---|---|
| 4,893,088 A | * | 1/1990 | Myers et al. | 327/336 |
| 4,894,620 A | * | 1/1990 | Nagaraj | 327/91 |
| 5,391,999 A | * | 2/1995 | Early et al. | 327/337 |
| 5,479,130 A | * | 12/1995 | McCartney | 327/341 |
| 5,914,638 A | * | 6/1999 | He | 330/258 |
| 6,288,669 B1 | * | 9/2001 | Gata | 341/172 |
| 6,469,561 B1 | * | 10/2002 | Pernigotti et al. | 327/336 |

OTHER PUBLICATIONS

Williams, et al. "Third-Order Sigma-Delta Modulator with Extended Dynamic Range", IEEE Journal of Solid-State Circuits, vol. 29, No. 3, Mar. 1994, pp. 193-202.
Grilo et al., "Predictive Correlated Double Sampling Switched-Capacitor Integrators", 1998 IEEE, pp. 9-12.
Huang et al. "Reduced Nonlinear Distortion in Circuits with Correlated Double Sampling", IEEE Transactions on Circuits and Systems—II: Analog and Digital Signal Processing, vol. 44, No. 7, Jul. 1997, pp. 593-597.
Nagaraj, et al. "Reduction of Finite-Gain Effect In Switched Capacitor Filters", Electronics Letter, Jul. 4, 1985, vol. 21, No. 14.

* cited by examiner

*Primary Examiner*—Kenneth B. Wells
(74) *Attorney, Agent, or Firm*—Iandiorio & Teska (57) ABSTRACT

A switched capacitor integrator system includes an input cascoded amplifier circuit; a summing junction; an integrating switched capacitor circuit connected to the output of the input cascoded amplifier circuit and to the summing junction; the integrating switched capacitor circuit including an input switched capacitor circuit responsive to an input and connected to the summing junction; and a correlated double sampling capacitor circuit including an offset capacitor interconnected between the summing junction and the input of the input cascoded amplifier circuit.

29 Claims, 6 Drawing Sheets

SWITCHED CAPACITOR INTEGRATOR SYSTEM

FIELD OF THE INVENTION

This invention relates to a switched capacitor integrator system.

BACKGROUND OF THE INVENTION

High performance system integrated circuits (IC) such as for wireless telecommunications or for internet data communications often need critical circuits including sigma delta analog to digital converters (ADC), filters, integrators, sample-holds, gain stages, delay stages, and so on, all of which contain a switched capacitor integrator circuit. These circuits require high resolution, good linearity and DC offset rejection for applications like temperature monitoring, data acquisition, and voice digitization. The key component of the integrator is its amplifier and the constancy of the summing junction. The performance is limited (1) by amplifier problems with offsets which drift with temperature, (2) by limited amplifier gain, (3) by input signal offsets and range problems, (4) by containing too many or too large components, (5) by containing components which do not track the temperature or supply characteristics of the other components, and (6) by extra components which introduce residual errors such as switch charge injection. Furthermore, on system IC's, in order to save die area and reduce chip size, it is necessary to use a circuit for multiple functions and with multiple inputs. This puts even more of a burden on the amplifier and degrades the integration of the signals.

Prior art uses various implementations of correlated double sampling (CDS) or predictive correlated double sampling (PCDS) to correct the amplifier gain and offset problems: Nagaraj, K. et al. "Reduction of finite gain effect in switched capacitor filters", Electronics Letters, Jul. 1985. Vol. 21, No. 15. p. 644. Williams, L. et al. "A third order sigma delta modulator with extended dynamic range", IEEE JSSC, Vol. 29, No. 3, Mar. 1994, p. 193. Huang, Y., Ferguson, P., Temes, G. "Reduced Nonlinear Distortion in circuits with correlated double sampling", IEEE Trans on circuits and systems II, Vol. 44, No. 7, Jul. 1997, p. 593. Grilo, J., et al. "Predictive correlated double sampling switched cap integrators", Electronics, Circuits, and Systems, 1998 IEEE International conference, Vol. 2, p. 9.

The performance of the amplifier and hence the integrator is determined by how stable (fixed) the summing junction remains when there is a change at the output of the amplifier due to the limited DC gain of the amplifier. CDS with an output holding capacitor keeps the output of the amplifier nearly constant by previously sampling and memorizing the output, thus the summing junction would also remain nearly constant; this is the same effect as if the limited amplifier gain were increased. At the same time, CDS reduces the amplifier offset problem by sampling and memorizing the offset and then later subtracting the offset from the integrated signal.

However, there are various implementation shortcomings of the prior CDS art, particularly when the techniques are implemented in a large system IC containing multiple and different kinds of inputs for a system using low power supplies. The previous solutions either address incorrectly or do not address the architecture of the amplifier which is critical for CDS (including predictive CDS, PCDS) implementation, because it would otherwise degrade the apparent gain of the amplifier through undesired charge sharing on capacitor dividers due to undesirable Miller capacitive effects occurring from the input to the output of the input transistors. This is particularly true now that two stage amplifiers are being used for low-power supply design reasons. Also the prior art does not utilize the additional advantages afforded by CDS through strategic placement of the switches and capacitors, nor do they reduce the number of components nor size of the implementations as much as possible, nor allow better temperature tracking of the components.

BRIEF SUMMARY OF THE INVENTION

It is therefore an object of this invention to provide an improved switched capacitor integrator system.

It is a further object of this invention to provide an improved switched capacitor integrator system which reduces finite gain problems, offset errors, and significant fluctuations at the output of the amplifier.

It is a further object of this invention to provide an improved switched capacitor integrator system which eliminates capacitor divider effects particularly from the Miller capacitance from the input to the output of the input transistors, whereby the effective capacitance is (multiplied) by the gain of the transistor.

It is a further object of this invention to provide an improved switched capacitor integrator system which is adapted to receive a number of different inputs both continuous and switched.

It is a further object of this invention to provide an improved switched capacitor integrator system which accommodates a switched capacitor centering circuit that tracks with the other components.

It is a further object of this invention to be able to sample the output of the integrator on either phase of the clock, such as for use in a sigma delta modulator.

The invention results from the realization that an improved switched capacitor integrator system with reduced gain problems, reduced offset errors, and higher linearity and resolution amplifier output voltage can be effected by applying an input cascoded amplifier architecture to reduce Miller capacitance for correlated double sampling to form an integrator, even in light of multiple inputs and functions. In addition, this particular implementation of CDS, its interconnections with coexisting circuit elements, works more effectively to make the new summing junction more stable and hence improve the linearity and resolution of the amplifier outputs.

This invention features a switched capacitor integrator system including an input cascoded amplifier circuit and maintaining the stability of the summing junction and correcting for offsets which drift. There is an integrating switched capacitor circuit connected to the output of the input cascoded amplifier and to the summing junction. The integrating switched capacitor circuit includes an input switched capacitor circuit responsive to an input and connected to the summing junction. A correlated double sampling capacitor circuit includes an offset capacitor interconnected between the summing junction and the input of the input cascoded amplifier circuit.

In the preferred embodiment the input switched capacitor circuit may include a variable capacitance circuit. The variable capacitance circuit may include a plurality of capacitors. It may include a plurality of switches at its input. It may include a plurality of switches at its output. The correlated double sampling capacitor circuit may include a hold capacitor interconnected to the output of the cascoded amplifier circuit and through a first switch to the input of the cascoded amplifier circuit and through a second switch to a bias voltage. The hold capacitor may be connected to the output of the cascoded amplifier circuit through a third switch. The input switched capacitor circuit may include a gain switching circuit. The summing junction may be adapted for receiving additional inputs. The additional inputs may include a digital to analog converter circuit. The inputs may include continuous voltage inputs. It may include a centering circuit and the additional inputs may include a centering circuit output. The centering circuit may include a center switching circuit responsive to an input source. The centering circuit may include a plurality of capacitors in the switching circuit to select a capacitor to provide a predetermined centering voltage. The system may be a single ended system. It may be a differential system and there may be a second complementary switched capacitor circuit and a second complementary correlated double sampling circuit. The input cascoded amplifier circuit may include a plurality of stages and at least the first stage input may be cascoded. The input stage of the amplifier may include an input differential cascoded transistor pair for reducing Miller effects from the input to the output of the input differential transistor pair. The cascoded amplifier circuit may include load circuits which may be e.g., current sources, resistors or diode connected MOSFET's.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

Figure 1:
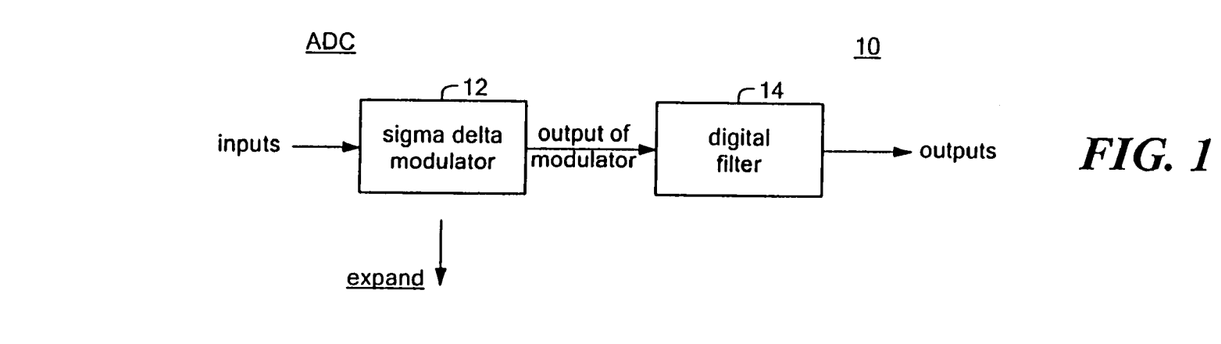
FIG. 1 is schematic block diagram of a sigma-delta type of analog to digital converter (ADC)
Figure 2:
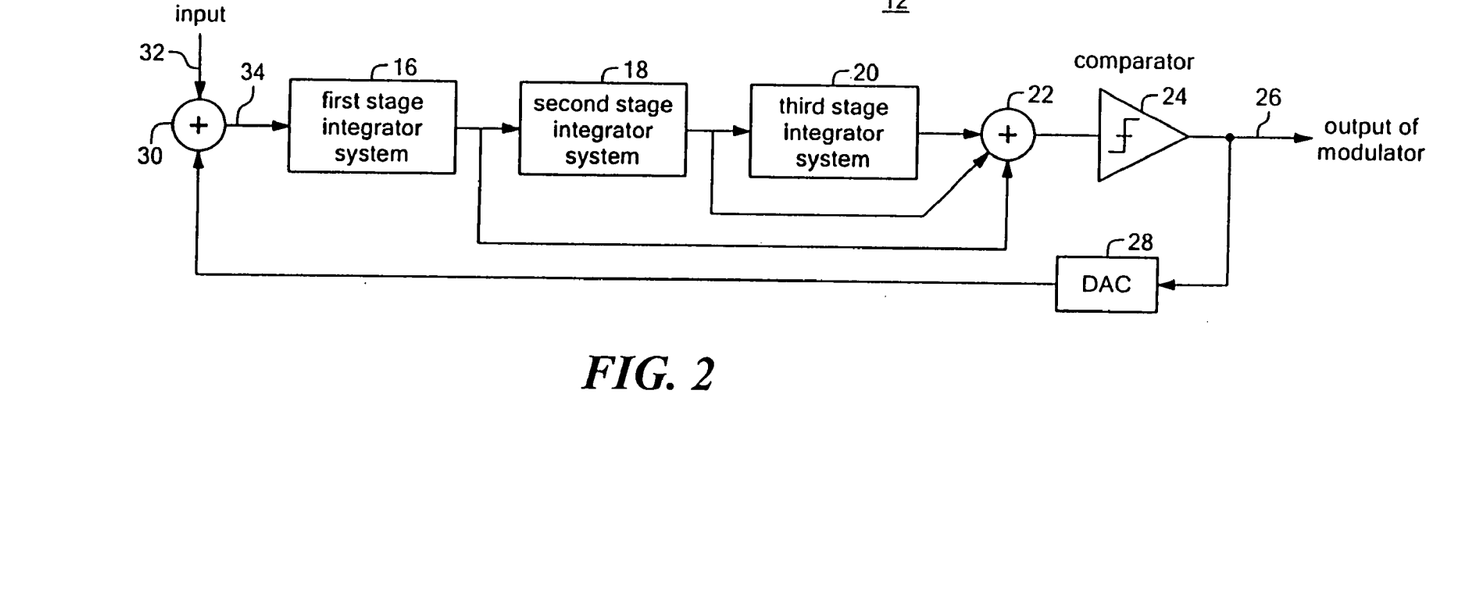
FIG. 2 is a more detailed schematic block diagram of the sigma delta modulator of FIG. 1.

There is shown in FIG. 1 a sigma-delta type of analog to digital converter 10 including a sigma delta modulator 12 and digital filter 14. The sigma-delta modulator 12 is a typical circuit that is implemented with one or more integrator system stages, FIG. 2; a first stage integrator system 16, second stage integrator system 18, and third stage integrator 20. The outputs of each of the integrator systems are combined in summing circuit 22 and submitted to comparator 24 whose output 26 constitutes the output of the sigma delta modulator 12. There is a feedback circuit through digital to analog converter 28 back to summing circuit 30 which combines the output of DAC 28 with the input on line 32 to provide the input on line 34 to the first stage integrator system 16. It is the first stage integrator system 16 that mainly determines the performance level of the entire sigma delta modulator, sample and hold circuit or other system in which the integrator systems are used.

Figure 3:
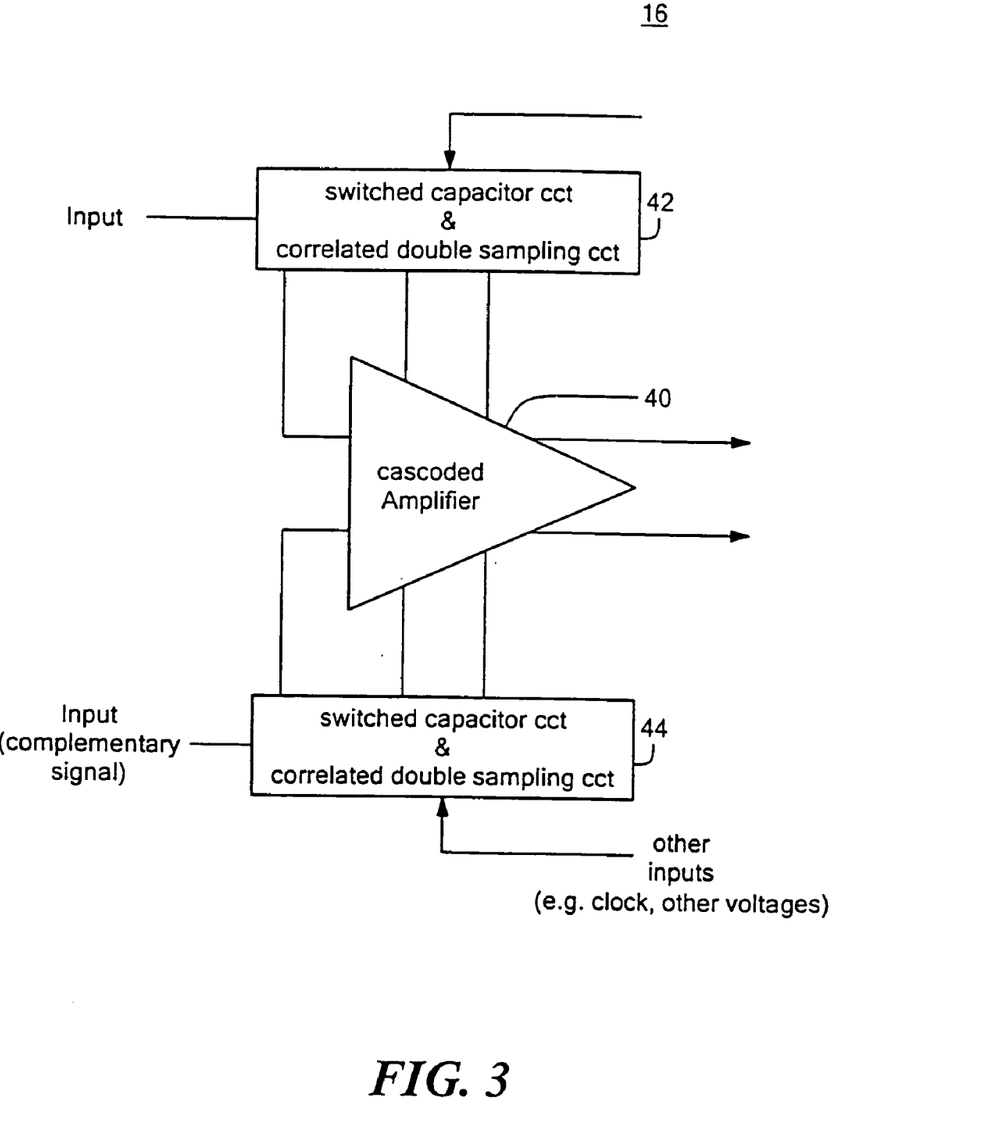
FIG. 3 is a more detailed view showing the first switched capacitor integrator system of FIG. 2.
Figure 4:
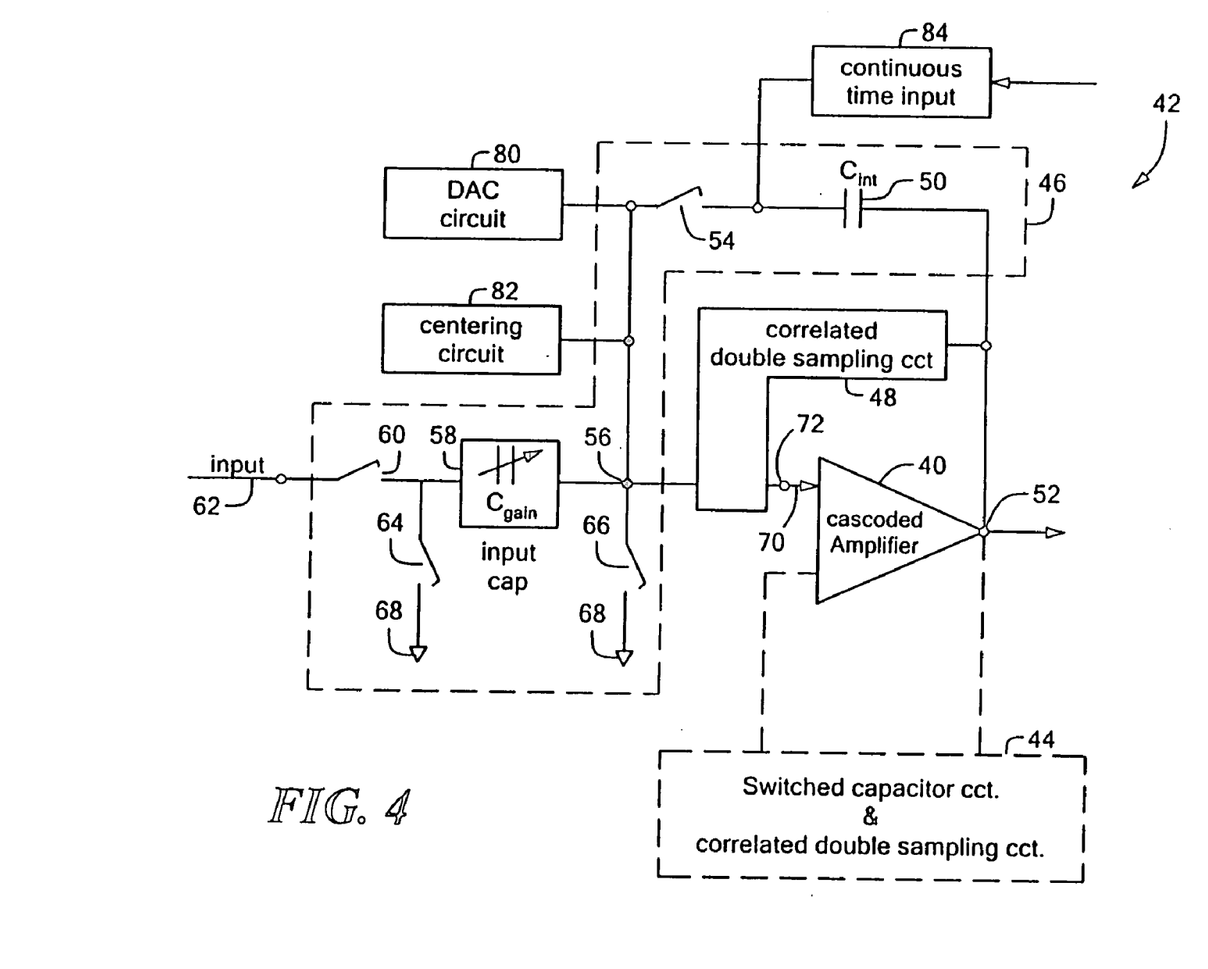
FIG. 4 is a more detailed view of one of the switched capacitor circuit and correlated double sampling circuit of FIG. 3.

In accordance with this invention the integrator systems, especially first integrator system 16, may be implemented as a switched capacitor integrator system, FIG. 3 including a cascoded amplifier 40 and either one or two switched capacitor circuits and correlated doubling sampling (CDS) circuits 42 and 44 depending upon whether it is a single ended or differential construction. In FIG. 3, switched capacitor integrator system 16 is shown as a differential construction. Switched capacitor circuit and correlated double sampling circuit 42, FIG. 4, includes an integrator switched capacitor circuit 46 and a correlated double sampling circuit 48. Integrator switched capacitor circuit 46 includes an integrating capacitor 50 connected between the output 52 of cascoded amplifier 40 and switch 54. Switch 54 is connected directly to summing node or junction 56 and then through input switched capacitor circuit 58 at switch 60 to input 62. Integrator switched capacitor circuit 46 also includes switches 64 and 66 each of which is connected to common bias voltage 68. Correlated double sampling circuit 48 is interconnected between the output 52 of amplifier 40 and the input 70 to that amplifier through amplifier input junction node 72 so that it extends between the amplifier input junction node 72 and the summing junction 56. Normally, without CDS, amplifier input junction node 72 would be the summing junction used but in accordance with this invention this node 72 is relegated to a secondary position and summing junction node 56 assumes the summing junction node role so that a number of inputs, such as input 62 or the input from DAC 80 or centering circuit 82 which are switched inputs, can be received at summing junction node 56 as well as continuous inputs such as provided by input 84 through switch 54. It is the provision of this summing junction node 56 available to the different inputs that make the switched capacitor integrator system of this invention more compatible with incorporation of a variety of high performance circuits such as can accommodate DAC, centering circuits, and other inputs making it useful in high performance integrated circuits used for systems.

Figure 5:
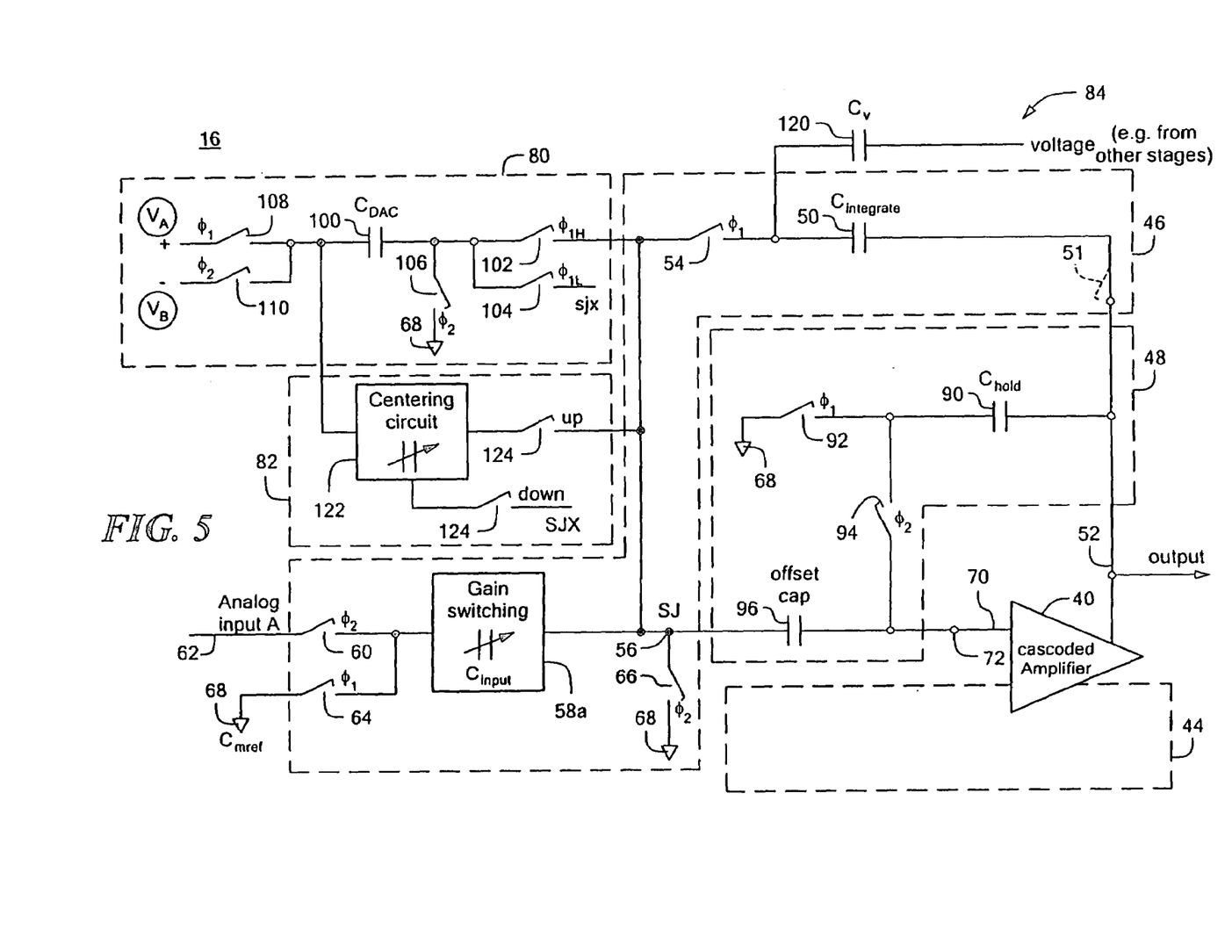
FIG. 5 is a more detailed circuit diagram of the switched capacitor and correlated double sampling circuit of FIG. 4.

As shown in more detail in FIG. 5, correlated double sampling circuit 48 includes a hold capacitor 90 in series with switch 92 connected to common reference 68 and a second switch 94 connected to amplifier input junction node 72 at the input 70 of amplifier 40. An offset capacitor 96 is also included interconnected between amplifier input junction node 72 and summing junction node 56. Offset capacitor 96 stores the value representing the summing junction error which may include effects of offset, noise, finite opamp gain, etc. of amplifier 40 in one clock cycle $\Phi_2$ and subtracts it from the integrated input signal on integration capacitor 50 at another clock cycle $\Phi_1$. Capacitor 50 need not be directly connected to output 52 of amplifier 40 but can be connected through a switch 51. In a similar fashion hold capacitor 90 samples and holds the value at the output 52 of amplifier 40 on clock cycle $\Phi_1$ and then continues to maintain that value plus a small offset at output 52 (when output is input referred) during clock cycle $\Phi_2$. Input capacitance 58, FIG. 4, may be implemented as a gain switching circuit 58a, FIG. 5. During clock cycle $\Phi_2$, the input signal at 62 is sampled through closed switch 60 on to the input capacitance or gain switching circuit 58a when the other side, the summing junction 56 is biased to voltage 68 when the switch 66 is closed. During this period switch 54 is open to integrating capacitor 50 so capacitor 50 simply maintains its voltage at this point. Also during $\Phi_2$, switch 94 is closed so that hold capacitor 90 which contains the charge from $\Phi_1$ cycle will now also form a capacitor divider with offset capacitor 96 which is charging to a value representing the summing junction error at the input of amplifier 40. Hold capacitor 90 samples the value of the signal output on phase $\Phi_2$ of the clock but maintains nearly this same value plus a small portion of the offset on cycle $\Phi_1$ such as for use (in the next stage of the) sigma-delta modulator. In some embodiments the contact 68 connected to switch 64 may be at a different potential to the contact 68 connected to switch 66 and neither one of those may be at the same potential as the contact 68 connected to switch 92. The requirements on these voltages are that they all need to be constant, but they do not all have to be equal.

Digital to analog converter 80 may include capacitor 100, switches 102, 104, and 106 and input switches 108 and 110 connected to $V_A$ and $V_B$, respectively, in the case of a one-bit DAC. During the clock cycle $\Phi_2$, switch 110 is closed, charging capacitor 100 when switch 106 is closed. Subsequently, at clock cycle $\Phi_1$ all of the switches marked $\Phi_2$ are open and those marked $\Phi_1$ are closed. During $\Phi_1$, integrator capacitor 50 sums all of the input contributions to its previous value. Thus, switch 60 is open and switch 64 is closed in switched capacitor circuit 46. Switch 94 in correlated double sampling circuit 48 is also open and switch 92 is closed so that during $\Phi_1$ capacitor 90 samples the voltage on node 52 while offset capacitance 96 applies the charge representing voltage offset at summing junction node 56 along with the input from capacitor or gain switching circuit 58a along with, for example, the input from DAC capacitor 80 and submits them all through closed switch 54 to the integrating capacitor 50. Switch 108 is closed applying $V_A$ to capacitor 100 and switch 106 is open. At this time in addition to those switched inputs, there is also available the continuous inputs such as provided by capacitor 120 in continuous time input 84 which may be, for example forwarded from other stages, and any other switched or continuous inputs. In addition, centering circuit 82 including the centering circuit 122 may provide an input bias to shift the input signal to properly align the output of the overall device such as an analog to digital converter in which the integrator 16 is included. Centering circuit 122 receives its input the reference voltages $V_A$ and $V_B$ through switches 108 and 110 and provides its output either to integrator switched capacitor circuit 46, if switch 124 receives an up signal, or to the counterpart switched capacitor circuit, not shown, in switched capacitor circuit and correlated double sampling circuit 44, if switch 126 receives a down signal. SJ represents the summing junction node 56 in switched capacitor circuit and correlated double sampling circuit 42 whereas node SJX represents the summing junction in switched capacitor circuit and predictive correlated double sampling circuit 44.

Figure 6:
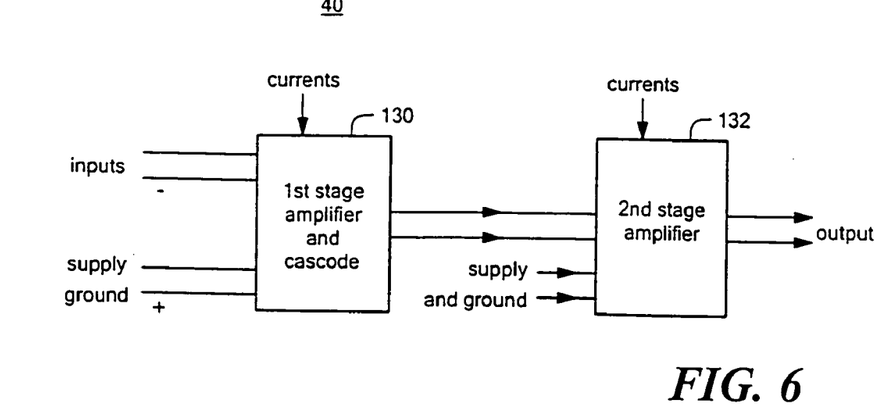
FIG. 6 is a more detailed view of the amplifier of FIGS. 3, 4, and 5.
Figure 7:
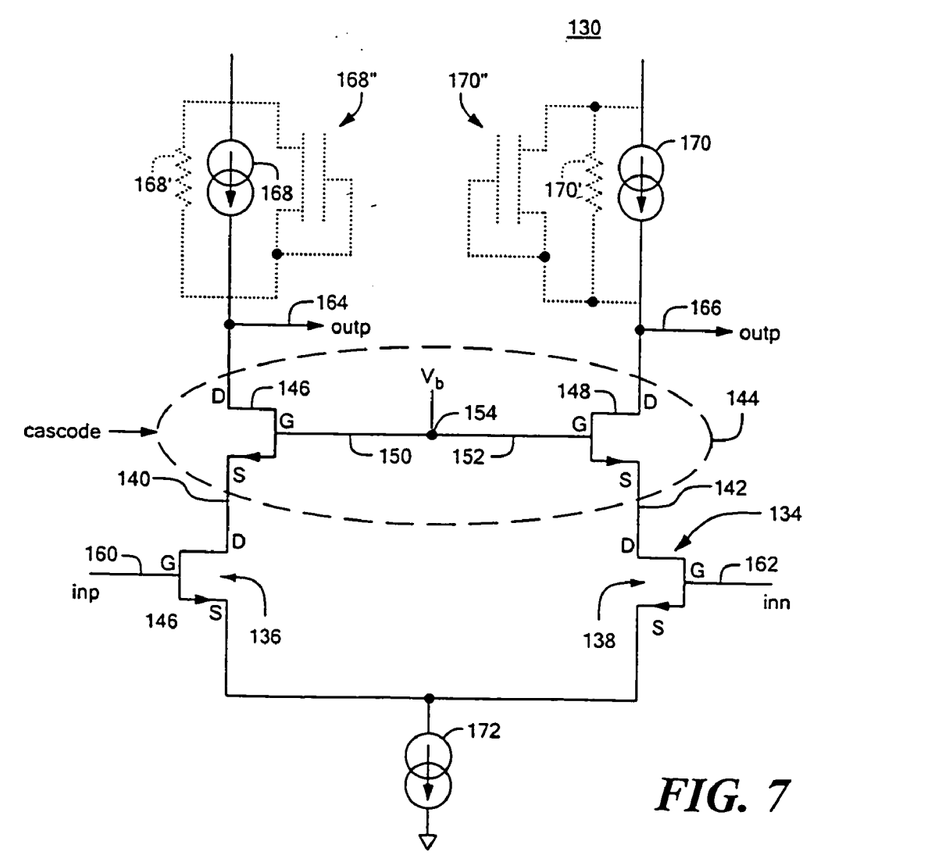
FIG. 7 is a more detailed view of a portion of the input cascoded first stage of FIG. 6.

Amplifier 40, FIG. 6, may include a number of stages, for example, for the popular two stage amplifier, there is a first amplifier stage 130 and second amplifier stage 132. In accordance with this invention, to obtain the improved performance, the first stage 130 has cascode transistors applied to the input transistors. Cascode amplifier, are an often used type of amplifier because they provide high gain. This invention results form the recognition that correlated double sampling can be done much more effectively using cascode amplifiers not for high gain reasons but rather an amplifier with the input differential pair cascoded effectively eliminates Miller capacitive effects from the input to the output of the input transistors thus maintaining better stability of the summing junction SJ, node 56 FIG. 5. For example, as shown in FIG. 7 the first stage of amplification 134 in first amplifier stage 130 includes a pair of transistors 136 and 138 whose outputs 140 and 142 are connected to a cascode circuit 144 containing two cascode transistors 146 and 148 with their gates 150 and 152 being connected to a bias voltage $V_b$. The input signals are provided at 160 and 162 to the gates of transistors 136 and 138 while the overall outputs 164 and 166 are taken from the drains of transistors 146 and 148. Load circuits 168 and 170 connected to the drain of each transistor 146 and 148, respectively, and a biasing current source 172 is connected to the source nodes of transistors 136 and 138. While load circuits 168 and 170 are pictured as current sources in FIG. 7, they may be any other suitable loads e.g., resistors 168', and 170', or diode connected MOSFET's 168" and 170". When used in a BiCMOS or bipolar process, appropriate bipolar transistors may be substituted for the MOSFET transistors.

Figure 8:
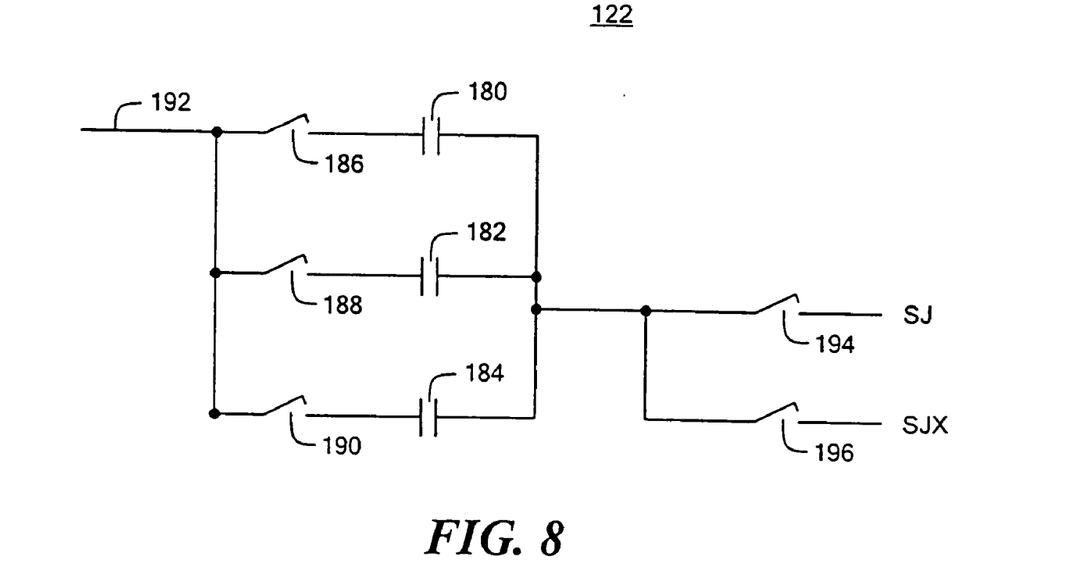
FIG. 8 is a more detailed schematic diagram of the centering circuit of FIGS. 4 and 5.
Figure 9:
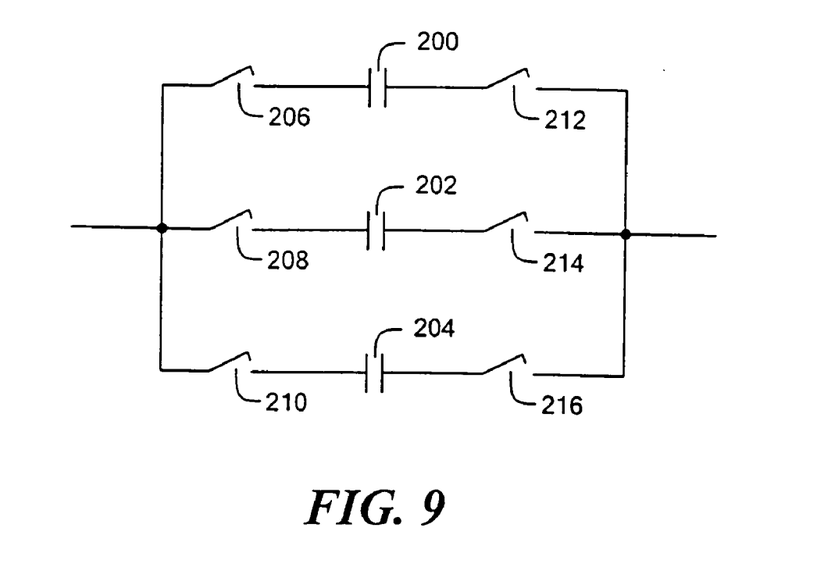
FIG. 9 is a more detailed schematic diagram of the input circuit of the integrating switched capacitor circuit of FIGS. 4 and 5.

The variable capacitance function of centering circuit 122, FIG. 8 may be produced with a plurality of capacitors 180, 182, 184 . . . in series with switches 186, 188, 190 . . . which are operated to selectively connect one of the capacitors to the input 192 and thereby provides a charge representing a centering voltage at either summing junction 56 (SJ), through switch 194 or through switch 196 to the counterpart summing junction SJX (not shown) in the switched capacitor circuit and correlated double sampling circuit 44. Like centering circuit 122, FIG. 8, input switched capacitor circuit or gain circuit 58 may also have its variable capacitance function implemented with a plurality of capacitors 200, 202, 204, FIG. 9 associated with input 206, 208, 210 and output 212, 214, 216 switches.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A switched capacitor integrator system comprising:
    an input cascoded amplifier circuit;
    an integrating switched capacitor circuit including an integrating capacitor and a summing junction, said integrating switched capacitor circuit connected to the output of said cascoded amplifier circuit and to said summing junction; said integrating switched capacitor circuit including an input switched capacitor circuit responsive to an input and connected to said summing junction; and
    a correlated double sampling capacitor circuit including an offset capacitor interconnected between said summing junction and an input of said cascoded amplifier circuit, the offset capacitor storing an offset voltage of the summing junction in one cycle, and subtracting the offset voltage from the output of the integrating capacitor in another cycle.

2. The switched capacitor integrator system of claim 1 in which said input switched capacitor circuit includes a variable capacitance circuit.

3. The switched capacitor integrator system of claim 2 in which said variable capacitance circuit includes a plurality of capacitors.

4. The switched capacitor integrator system of claim 3 in which said variable capacitance circuit includes a plurality of switches at its input.

5. The switched capacitor integrator system of claim 3 in which said variable capacitance circuit includes a plurality of switches at its output.

6. The switched capacitor integrator system of claim 1 in which said correlated double sampling capacitor circuit includes a hold capacitor interconnected to the output of said cascoded amplifier circuit and through a first switch to the input of said cascoded amplifier circuit and through a second switch to a bias voltage.

7. The switched capacitor integrator system of claim 6 in which said hold capacitor is connected to said output of said cascoded amplifier circuit.

8. The switched capacitor integrator system of claim 1 in which said input switched capacitance circuit includes a gain switching circuit.

9. The switched capacitor integrator system of claim 1 in which said summing junction is adapted for receiving additional inputs.

10. The switched capacitor integrator system of claim 9 in which said additional inputs include a digital to analog converter (DAC) circuit.

11. The switched capacitor integrator system of claim 10 including a centering circuit and said additional inputs include a centering circuit output.

12. The switched capacitor integrator system of claim 11 in which said centering circuit includes a center switching circuit responsive to an input source that may be shared with the DAC.

13. The switched capacitor integrator system of claim 1 which is a single ended system.

14. The switched capacitor integrator system of claim 1 which is a differential system and there is a second complementary switched capacitor circuit and a second complementary correlated double sampling circuit.

15. The switched capacitor integrator system of claim 1 in which said inputs include continuous voltage inputs.

16. The switched capacitor integrator system of claim 1 in which said cascoded amplifier circuit includes a plurality of stages and at least the first stage input is cascoded.

17. The switched capacitor integrator system of claim 11 in which said centering circuit includes a plurality of capacitors and a switching circuit to select a capacitor to provide a predetermined centering voltage.

18. The switched capacitor integrator system of claim 16 in which said first stage includes an input differential cascoded transistor pair for reducing Miller capacitance effects from the input to the output of said input differential transistor pair.

19. The switched capacitor integrator system of claim 1 in which said cascoded amplified circuit includes a load circuit.

20. The switched capacitor integrator system of claim 19 in which said cascoded load circuit includes current sources.

21. The switched capacitor integrator system of claim 19 in which said cascoded load circuit includes resistors.

22. The switched capacitor integrator system of claim 19 in which said cascoded load circuit includes diode connected MOSFET's.

23. The switched capacitor integrator system of claim 1 in which said cascoded amplifier circuit includes a plurality of stages and at least the first stage includes an input differential cascoded transistor pair for reducing Miller capacitance effects from the input to the output of said input differential transistor pair.

24. A switched capacitor integrator system comprising:

an input cascoded amplifier circuit;

an integrating switched capacitor circuit including an integrating capacitor and a summing junction, said integrating switched capacitor circuit connected to the output of said cascoded amplifier circuit and to said summing junction; said integrating switched capacitor circuit including an input switched capacitor circuit responsive to an input and connected to said summing junction; and a correlated double sampling capacitor circuit including an offset capacitor interconnected between said summing junction and an input of said cascoded amplifier circuit and including a hold capacitor interconnected to the output of said cascoded amplifier circuit and through a first switch to the input of said cascoded amplifier circuit and through a second switch to a bias voltage, the offset capacitor storing an offset voltage of the summing junction in one cycle, and subtracting the offset voltage from the output of the integrating capacitor in another cycle.

25. A switched capacitor integrator system comprising:

an input cascoded amplifier circuit;

an integrating switched capacitor circuit including an integrating capacitor and a summing junction, said integrating switched capacitor circuit connected to the output of said cascoded amplifier circuit and to said summing junction; said integrating switched capacitor circuit including an input switched capacitor circuit responsive to an input and connected to said summing junction, said input switched capacitance circuit including a gain switching circuit; and a correlated double sampling capacitor circuit including an offset capacitor interconnected between said summing junction and an input of said cascoded amplifier circuit the offset capacitor storing the voltage offset of the summing junction in one cycle, and subtracting the voltage offset from the output of the integrating capacitor in another cycle.

26. A switched capacitor integrator system comprising:

an input cascoded amplifier circuit;

an integrating switched capacitor circuit including an integrating capacitor and a summing junction, said integrating switched capacitor circuit connected to the output of said cascoded amplifier circuit and to said summing junction; said integrating switched capacitor circuit including an input switched capacitor circuit responsive to an input and connected to said summing junction, said summing junction adapted for receiving additional inputs including a digital to analog converted (DAC) circuit; and a correlated double sampling capacitor circuit including an offset capacitor interconnected between said summing junction and an input of said cascoded amplifier circuit the offset capacitor storing the voltage offset of the summing junction in one cycle, and subtracting the voltage offset from the output of the integrating capacitor in another cycle.

27. The switched capacitor integrator system of claim 26 including a centering circuit and said additional inputs include a centering circuit output.

28. The switched capacitor integrator system of claim 27 in which said centering circuit includes a center switching circuit responsive to an input source that may be shared with the DAC.

29. The switched capacitor integrator system of claim 27 in which said centering circuit includes a plurality of capacitors and a switching circuit to select a capacitor to provide a predetermined centering voltage.

* * * * *